United States Patent
Habermeier et al.

[11] Patent Number: 5,933,946
[45] Date of Patent: Aug. 10, 1999

[54] PROCESS FOR PROVIDING AN ELECTRONIC MODULE WITH A COVER AND TERMINAL PINS

[75] Inventors: Hans Habermeier, Egweil; Günther Jesinger, Nürnberg, both of Germany

[73] Assignee: Temic Telefunken Hochfrequenztechnik GmbH, Grossmehring, Germany

[21] Appl. No.: 08/834,104

[22] Filed: Apr. 14, 1997

[30] Foreign Application Priority Data

May 8, 1996 [DE] Germany .......................... 196 18 481

[51] Int. Cl.⁶ ...................................................... H05K 3/30
[52] U.S. Cl. ................... 29/837; 29/839; 29/843; 29/566.3; 174/52.1; 361/816
[58] Field of Search .............................. 29/837, 839, 843, 29/844, 845, 877, 566.2, 566.3, 827; 361/816, 818; 174/52.1

[56] References Cited

U.S. PATENT DOCUMENTS

| | | | |
|---|---|---|---|
| 3,566,464 | 3/1971 | Bakermans | 29/566.2 |
| 3,605,237 | 9/1971 | Bakermans | 29/566.2 |
| 3,668,299 | 6/1972 | McNeal | 29/843 X |
| 4,177,554 | 12/1979 | Deveres et al. | 29/566.2 |
| 4,551,901 | 11/1985 | Bonifanti et al. | 29/566.2 X |
| 4,612,700 | 9/1986 | Loomis et al. | 29/566.2 X |
| 4,639,056 | 1/1987 | Lindeman et al. | 29/841 X |
| 4,642,872 | 2/1987 | Grabbe et al. | 29/566.2 |
| 4,772,761 | 9/1988 | Ibrahim et al. | 29/841 X |
| 4,841,414 | 6/1989 | Hibino et al. | 361/818 |
| 5,043,848 | 8/1991 | Rogers et al. | 361/816 |
| 5,159,537 | 10/1992 | Okano . | |
| 5,162,971 | 11/1992 | Sato et al. . | |
| 5,559,676 | 9/1996 | Gessaman | 361/816 X |

FOREIGN PATENT DOCUMENTS 6-169171  6/1994  Japan ........................... 29/846

*Primary Examiner*—Lee W. Young
*Assistant Examiner*—Rick Kiltae Chang
*Attorney, Agent, or Firm*—Venable; Norman N. Kunitz

[57] ABSTRACT

A process for manufacturing an electronic module comprising a board populated with electronic components and provided with terminal pins and a housing shell; this process features the following process steps:

the terminal pins and the housing shell form a one-piece unit, the housing shell is mounted on the board by simultaneously bringing the terminal pins into their intended fitting positions on the board and electrically connecting them with the board, and finally the terminal pins and the housing shell are separated from each other during final assembly by use of a cutting tool.

6 Claims, 2 Drawing Sheets

PROCESS FOR PROVIDING AN ELECTRONIC MODULE WITH A COVER AND TERMINAL PINS

BACKGROUND OF THE INVENTION

The invention concerns a process for manufacturing an electronic module comprising a board populated with electronic components and provided with terminal pins and a housing part; this process features the following process steps:

- the terminal pins and the housing part feature a one-piece design,
- the housing part is mounted on the board by simultaneously bringing the terminal pins into their intended fitting positions and electrically connecting them with the board, and finally
- the terminal pins and the housing part will be separated again during final assembly by means of a cutting tool.

With a state of the art electronic module, a board intended for mounting electronic components will be covered by a hood-type metal housing shell. The board features a so-called pin contact strip for contacting the electronic module with other electronic circuit points; this pin contact strip allows terminal pins to be inserted through boreholes in the board and through a plastic strip fitted to the board. The boreholes in the board are surrounded by track conductors such that subsequent tin-coating will provide a galvanic connection between track conductor and terminal pin.

This arrangement is disadvantageous in that the contact strip described above needs to be fitted to the board in a separate process step. In addition to the necessary material costs, total costs thus need to include the relevant fitting costs as well.

SUMMARY OF THE INVENTION

The object of the invention is to provide an electronic module which can be manufactured at reduced material and lower fitting costs.

According to the invention there is a process where, for manufacturing an electronic module comprising a board populated with electronic components and provided with terminal pins and a housing part, the following process steps are carried out:

- the terminal pins and the housing part form a one-piece unit or unitary structure,
- the housing part is mounted on the board while simultaneously bringing the terminal pins into their intended fitting positions and electrically connecting them with the board, and finally
- the terminal pins and the housing part will be separated during final assembly by means of a cutting tool.

Advantageous further applications of the invention are described in the sub-claims.

The advantages of the invention are that the board for mounting electronic components does not need to be fitted with an expensive pin contact strip, using an additional process step for the purpose; this simplifies the assembly process and reduces costs.

BRIEF DESCRIPTION OF THE DRAWINGS

An embodiment of the invention is explained in detail below and illustrated by the figures attached wherein.

DESCRIPTION OF THE PREFERRED EMBODIMENTS

Figure 1:
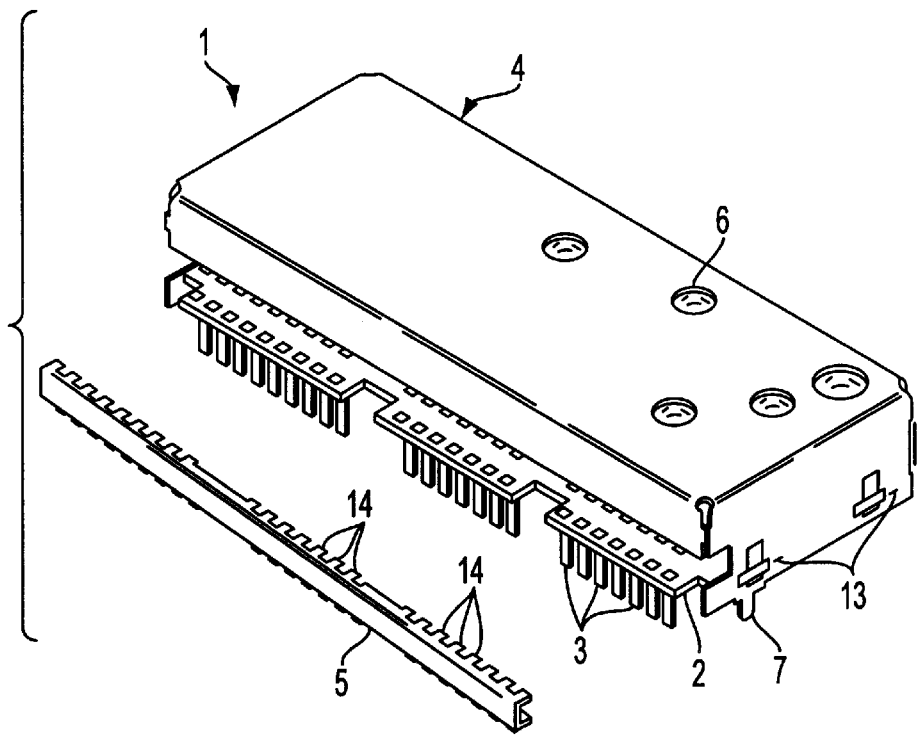
FIG. 1 shows a timer unit used as an embodiment of the electronic module according to this invention, comprising a board complete with terminal pins and a folded housing shell.
Figure 2:
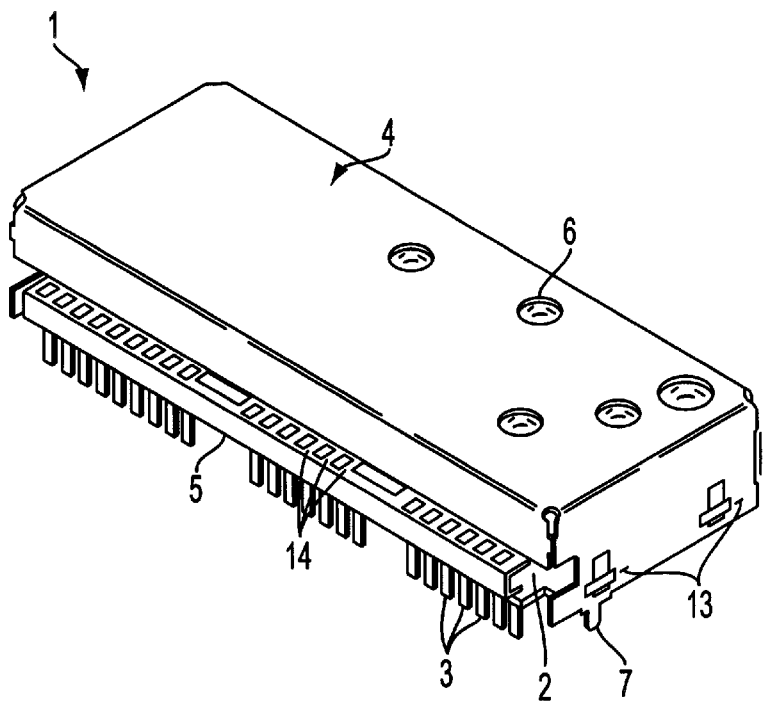
FIG. 2 shows the electronic module from FIG. 1 during assembly.

FIGS. 1 and 2 illustrate an electronic module 1, comprising a board 2 populated with electronic components and provided with terminal pins 3, a folded metal housing shell 4, as well as a crimped junction element 5 complete with apertures 14. Housing shell 4, terminal pins 3, and junction element 5 are punched from a single sheet of metal by means of a punch process, where—as shown in FIG. 2—junction element 5 initially still joins housing shell 4 to terminal pins 3 (these have already been separated). FIG. 1 shows junction element 5 which has been cut off meanwhile by means of a further punch or cutting process. At pressed-in points 13 in housing shell 4, a latch point for the board 2 is created by means of a known process, so that the board 2 and housing shell 4 are firmly but removably connected to each other. In housing shell 4, apertures 6 are provided in order to allow access to timing elements located on the board 2. Using shielding terminals 7, the electronic module 1 will—for example—be mounted onto a further board, not shown here, by inserting the shielding terminals 7 through boreholes and then bending them over and, if necessary, additionally soldering them on. In order to ensure maximum possible electromagnetic compatibility of the electronic module 1, housing shell 4 must consist of a material with good conductivity properties, ideally some sheet metal, and also be connected to the reference potential by means of the shielding terminals 7.

Figure 3:
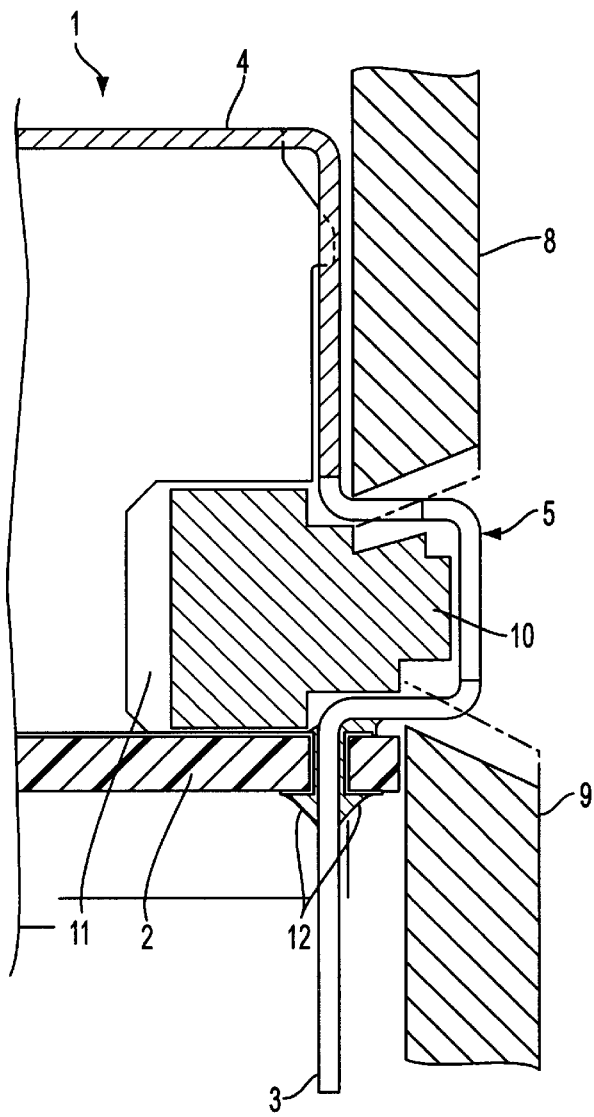
FIG. 3 shows a cutting tool for re-working the electronic module of FIG. 2.

FIG. 3 shows the electronic module I when placed inside a cutting tool with the junction element 5, which has not yet been cut off, still joining the housing shell 4 with terminal pins 3. The cutting tool here consists of two cutting punches 8 and 9, and a die 10. In order to allow the die 10 to be pushed from one side behind junction element 5, housing shell 4 features a recess 11. During the cutting process the punches 8 and 9 will be moved towards die 10 into the position marked by broken lines so that the junction element 5 will be separated from housing shell 4 and terminal pins 3. The terminal pins 3 are connected to the track conductors of the board 2 by means of soldering tin 12.

In order to exclude any deformation of the die 10 by bending forces due to varying cuffing forces, on the one hand, punches 8 and 9 will be moved simultaneously towards the die 10. On the other hand, the junction element 5 is provided with apertures 14 (FIGS. 1, 2) on the face located opposite terminal pins 3 so that the areas to be cut on the top and bottom faces of junction element 5 are of equal size. Thus the two forces acting upon die 10 will compensate each other and prevent the die from being bent.

Figure 4:
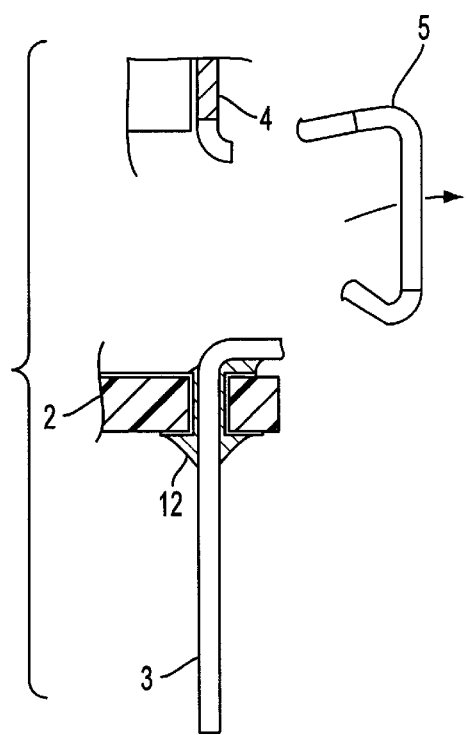
FIG. 4 is a sectional enlargement of the electronic module after it has been re-worked by means of the cutting tool according to FIG. 3.

FIG. 4 shows an enlarged sectional view of the arrangement following the cutting process which separated the junction element 5—now no longer required—from housing shell 4 and terminal pins 3. The soldering tin 12 provides for a mechanical and galvanic connection between terminal pins 3 and the track conductors of the populated board 2.

The electronic module according to this invention, complete with folded housing shell, is suitable for example for radio and television tuners, and video recorders, where the electronic tuner components, for better electronic compatibility, need to be shielded by a conductive and hood-type housing shell, and where the populated board of the tuner is connected with other points in the circuit.

What is claimed is:

1. A process for manufacturing an electronic module comprising a board populated with electronic components and provided with terminal pins and a housing shell, comprising the following process steps:

providing the terminal pins and the housing shell as a one-piece unit, mounting the housing shell on the board while simultaneously bringing the terminal pins into fitting positions on the board and electrically connecting the terminal pins with the board, and separating the terminal pins and the housing shell from each other by use of a cutting tool.

2. The process according to claim 1 wherein the terminal pins are connected to the housing shell by a U-shaped connection piece which is cut off and removed during said step of separating.

3. The process according to claim 2 wherein the connection piece features apertures at a top surface that correspond to intermediate spaces between the terminal pins on a bottom of the connection piece.

4. The process according to claim 3 wherein a recess formed to fit with a cutting tool die is provided in a U-shaped connection piece area within the housing shell.

5. The process according to claim 1 wherein the housing shell and the terminal pins are made up of sheet metal with good conductivity properties.

6. The process according to claim 1 wherein the housing shell is a hood-type cover.

* * * * *